(12) United States Patent
Hwang et al.

(10) Patent No.: US 12,111,527 B2
(45) Date of Patent: Oct. 8, 2024

(54) DISPLAY DEVICE, APPARATUS FOR MANUFACTURING THE SAME, AND METHOD OF MANUFACTURING THE DISPLAY DEVICE

(71) Applicant: Samsung Display Co., Ltd., Yongin-Si (KR)

(72) Inventors: Hyeon Deuk Hwang, Cheonan-si (KR); Yunjeong Cho, Cheonan-si (KR); Kyunghoon Chae, Asan-si (KR); Simhee Ryu, Bucheon-si (KR); Je Yoon Yoo, Cheonan-si (KR); Sung Soo Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 308 days.

(21) Appl. No.: 17/477,695

(22) Filed: Sep. 17, 2021

(65) Prior Publication Data
US 2022/0173286 A1 Jun. 2, 2022

(30) Foreign Application Priority Data
Dec. 1, 2020 (KR) .................. 10-2020-0166052

(51) Int. Cl.
| G02F 1/1333 | (2006.01) |
| G02F 1/13 | (2006.01) |
| H01L 33/00 | (2010.01) |
| H01L 33/54 | (2010.01) |
| H05K 1/18 | (2006.01) |

(52) U.S. Cl.
CPC ...... *G02F 1/133351* (2013.01); *G02F 1/1303* (2013.01); *G02F 1/133354* (2021.01); *H01L 33/0095* (2013.01); *H01L 33/54* (2013.01); *H05K 1/189* (2013.01); *H05K 2201/10128* (2013.01)

(58) Field of Classification Search
None
See application file for complete search history.

(56) References Cited

U.S. PATENT DOCUMENTS

2019/0061207 A1\* 2/2019 Terao .................... G03F 7/0002

FOREIGN PATENT DOCUMENTS

| KR | 10-0893739 | 4/2009 |
| KR | 10-2016-0116797 | 10/2016 |

\* cited by examiner

*Primary Examiner* — Dung T Nguyen
(74) *Attorney, Agent, or Firm* — CHAU & ASSOCIATES, LLC

(57) ABSTRACT

A manufacturing method of a display device includes providing a display module including a display panel, a first flexible circuit board disposed at a first side edge of the display panel, a window disposed on the display panel, and an optical film disposed between the display panel and the window on the stage; aligning the display module such that the first side edge is disposed under the bonding unit; moving the position detection sensor along the first side edge of the display module to sense a first coating path; moving the resin supply unit along the sensed first coating path to coat a first filling agent between the window and the display panel; and moving the light irradiation unit along the sensed first coating path to cure the coated first filling agent to form a first filling layer.

7 Claims, 11 Drawing Sheets

DISPLAY DEVICE, APPARATUS FOR MANUFACTURING THE SAME, AND METHOD OF MANUFACTURING THE DISPLAY DEVICE

CROSS-REFERENCE TO RELATED APPLICATION

This U.S. non-provisional patent application claims priority under 35 U.S.C. § 119 to Korean Patent Application No. 10-2020-0166052, filed on Dec. 1, 2020, the disclosure of which is incorporated by reference herein in its entirety.

TECHNICAL FIELD

The present disclosure relates to a display device, an apparatus for manufacturing the same, and a method of manufacturing the display device. More particularly, the present disclosure relates to a display device including a filling layer disposed between a window and a display panel, an apparatus for manufacturing the display device, and a method of manufacturing the display device.

DISCUSSION OF THE RELATED ART

A display device can display a variety of images on a display screen to provide information to a user. In general, the display device displays the information within an assigned screen. The display device includes electronic components to display information on the screen, and may also include a shock absorbing layer to protect the electronic components included therein.

Conventional display devices may be fabricated with resin layers filled in between other functional layers. However, in some cases, these conventional display devices and their associated fabrication methods may risk releasing the filling outside of its intended area, resulting in visual and functional defects. Accordingly, various filling methods are being studied to form the shock absorbing layer in various shapes of display devices.

SUMMARY

The present disclosure provides a display device having superior shock resistance.

The present disclosure provides an apparatus for manufacturing the display device.

The present disclosure provides a method of manufacturing the display device.

The present disclosure provides a method of manufacturing a display device, wherein the method includes providing a display device manufacturing apparatus including a stage, a fixing unit, and a bonding unit disposed on the stage and including a position detection sensor, a resin supply unit, and a light irradiation unit. The method further includes disposing a display module on the stage, where the display module includes a display panel including an active area and a peripheral area and a first side edge, a first flexible circuit board disposed in the peripheral area near the first side edge of the display panel, a window disposed on the display panel, and an optical film disposed between the display panel and the window, aligning the display module such that the first side edge of the display, module is disposed under the bonding unit, moving the position detection sensor along the one side edge of the display module to sense a first coating path, moving the resin supply unit along the sensed first coating path to coat a first filling agent between the window and the display panel, and moving the light irradiation unit along the sensed first coating path to cure the coated first filling agent to form a first filling layer.

The position detection sensor, the resin supply unit, and the light irradiation unit are arranged such that the resin supply unit is in between the position detection sensor and the light irradiation unit, and the resin supply unit and the position detection sensor maintain a first distance from each other while moving along the first coating path in the coating of the first filling agent.

The light irradiation unit and the resin supply unit maintain a second distance from each other while moving along the first coating path in the forming of the first filling layer.

The coating of the first filling agent includes coating the first filling agent in a space defined by the display panel, the window facing the display panel, and a side surface of the optical film that is exposed.

The first coating path corresponds to a shape of the first side edge of the display module and is an imaginary line positioned between the window and the display panel.

The display module further includes a second flexible circuit board disposed in the peripheral area at a second side edge of the active area and spaced apart from the first flexible circuit board. After the forming of the first filling layer, the method further includes aligning the display module such that the second side edge of the display module is disposed under the bonding unit, moving the position detection sensor along the other side edge of the display module to sense a second coating path, moving the resin supply unit along the sensed second coating path to coat a second filling agent between the window and the display module, and moving the light irradiation unit along the sensed second coating path to cure the coated second filling agent to form a second filling layer.

The second coating path corresponds to a shape of the second side edge of the display module and is an imaginary line positioned between the window and the display panel.

Embodiments of the inventive concept provide an apparatus for manufacturing a display device including a stage, a bonding unit disposed on the stage and including a position detection sensor, a resin supply unit, and a light irradiation unit, and a fixing unit disposed closer to the stage than the bonding unit is to fix a target member.

The target member is a display module including a display panel including an active area and a peripheral area, a first side edge, a first flexible circuit board disposed in the peripheral area near the first side edge of the display panel, a window disposed on the display panel, and an optical film disposed between the display panel and the window, and where the position detection sensor is a laser sensor that senses a coating path between the window and the display panel using a laser beam.

The light irradiation unit provides an ultraviolet light.

The position detection sensor and the resin supply unit maintain a first distance from each other while moving.

The resin supply unit and the light irradiation unit maintain a second distance from each other while moving, and the second distance is smaller than the first distance.

Embodiments of the inventive concept provide a display device including a display panel including an active area and a peripheral area and a first side edge, a first flexible circuit board disposed in the peripheral area near the first side edge of the display panel, a window disposed on the display panel, an optical film disposed between the display panel and the window, and a first filling layer filled in a space defined by the window, the display panel, and a side surface of the optical film that is exposed and covering the first flexible circuit board.

The display panel includes a base substrate, a light emitting element layer disposed on the base substrate, and an encapsulation layer disposed on the light emitting element layer, and an edge of the encapsulation layer is disposed inside an edge of the base substrate near the first side edge of the display panel.

The first flexible circuit board is disposed on the base substrate at the first side edge.

The display device further includes an optically clear adhesive layer disposed between the optical film and the window.

The first filling layer is filled in a space defined by the window, the display panel, the side surface of the optical film that is exposed, and the optically clear adhesive layer that is exposed.

The display device further includes a second flexible circuit board spaced apart from the first flexible circuit board and disposed in the peripheral area at a second side edge of the display panel and a second filling layer filled in a space defined by the window, the display panel, and a side surface of the optical film that is exposed and covering the second flexible circuit board.

The display panel includes a base substrate, a light emitting element layer disposed on the base substrate, and an encapsulation layer disposed on the light emitting, element layer, and one side of the second flexible circuit board is disposed on the encapsulation layer, and the other side of the second flexible circuit board is disposed under the base substrate.

The second filling layer is disposed directly on the encapsulation layer and the second flexible circuit board near the second side edge.

According to the above, the display device includes the filling layer filled in between the window and the display panel, and thus, the shock resistance of the display device is increased.

According to the above, the display device manufacturing apparatus includes the position detection sensor that senses the coating path, and thus, the resin layer may be stably provided to a target member with curvature, for example, to a display device with a curved screen.

According to the above, the manufacturing method of the display device includes the sensing of the coating path, and thus, the filling layer is filled in the space between the window and the display panel without leaving empty space.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

Figure 1:
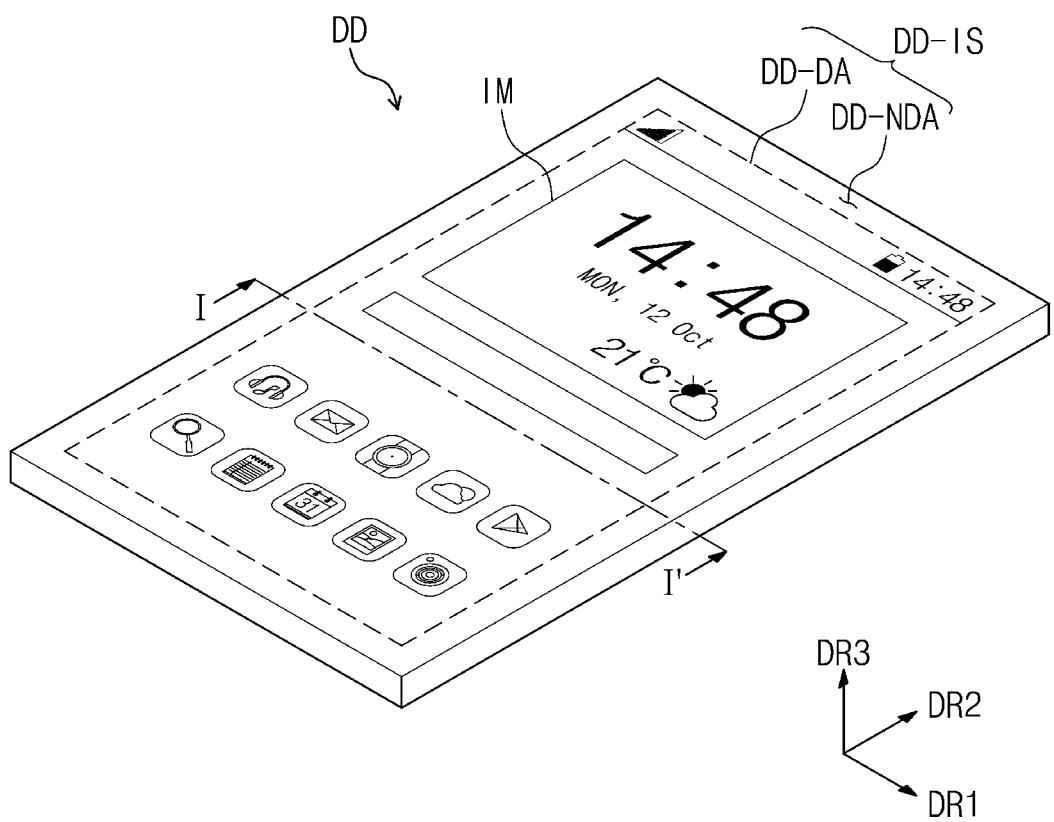
FIG. 1 is a perspective view showing a display device according to an embodiment of the present disclosure.

The present disclosure may be variously modified and realized in many different forms, and thus specific embodiments will be illustrated in the drawings and described in detail herein below. However, the present disclosure should not necessarily be limited to the specific disclosed forms, and should be construed to include all modifications, equivalents, or replacements included in the spirit and scope of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout, and to the extent that a description of an element has been omitted, it may be understood that the element is at least similar to corresponding elements that are described elsewhere in the specification. In the drawings, the thickness, ratio, and dimension of components may be exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, description of singular components may apply to a plurality of the same components, unless the context clearly indicates otherwise.

It will be understood that when an element is referred to as being disposed "on" another element, the element may be disposed on an upper portion or a lower portion of the another element.

Spatially relative terms, such as "beneath", "below", "lower", "above", "upper" and the like, may be used herein for ease of description to describe one element or feature's relationship to another element(s) or feature(s) as shown in the figures. When something is described as exposed to, emitted to, etc. "to the outside", "the outside" may refer to anything external to the currently described embodiment.

Unless otherwise defined, all terms including technical and scientific terms used herein have the same meaning as commonly understood by one of ordinary skill in the art to which this disclosure belongs, it will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, a display device, an apparatus for manufacturing the display device, and a method of manufacturing the display device will be explained in detail with reference to the accompanying drawings.

FIG. 1 is a perspective view showing a display device DD according to an embodiment of the present disclosure.

Referring to FIG. 1, the display device DD may display an image IM through a display surface DD-IS. In FIG. 1, the display device DD is provided with the flat display surface DD-IS, however, it should not necessarily be limited thereto. For example, the display device DD may include a curved display surface or a three-dimensional display surface. The three-dimensional display surface may include a plurality of display areas facing different directions from each other, and may have, for example, a column-shaped display surface and a polygonal cross section if the associated display device.

According to an embodiment, the display device DD may be a flexible display device, however, it should not necessarily be limited thereto. For example, the display device DD may be a rigid display device.

Electronic modules mounted on a main board, a camera module, and a power supply module may be accommodated in a bracket and a case together with the display device DD to form a mobile phone terminal. The display device DD according to the present disclosure may be applied to a large-sized electronic item, such as a television set and a monitor. Further, the display device DD according to the present disclosure may be applied to a small and medium-sized electronic item, such as a tablet computer, a car navigation unit, a game unit, and a smart watch.

The display surface DD-IS may be substantially parallel to a plane defined by a first direction DR1 and a second direction DR2. A third direction DR3 may refer to a normal line direction of the display surface DD-IS, e.g., a thickness direction of the display device DD. In the following descriptions, an expression "when viewed in a plane", "on a plane", or "an area in a plane" may refer to being viewed in the third direction DR3; for example, as being viewed in a top-down view. Further, when a component is described as "laterally surrounding" another component, the component may surround all sides of the surrounded component in a plan view (e.g., the surrounding component might not surround the surrounded component on a top or bottom side). Hereinafter, front (or upper) and rear (or lower) surfaces of each member or each unit of the display device DD may be distinguished from each other by the third direction DR3. However, directions indicated by the first, second, and third directions DR1, DR2, and DR3 are relative to each other, and thus, the directions indicated by the first, second, and third directions DR1, DR2, and DR3 may be changed to other directions to apply to other embodiments of the present disclosure.

As shown in FIG. 1, the display surface DD-IS includes a display area DD-DA through which the image IM is displayed and a on-display area DD-NDA defined adjacent to the display area DD-DA. The image IM is not displayed through the non-display area DD-NDA. FIG. 1 shows application icons and a clock widget as a representative example of the image IM.

In addition, the display area DD-DA may a quadrangular shape, and the non-display area DD-NDA may laterally surround the display area DD-DA. However, the present inventive concept should not necessarily be limited thereto, and the shape of the display area DD-DA and the shape of the non-display area DD-NDA may be designed relative to each other. For example, the non-display area DD-NDA may be disposed adjacent to only one side of the display area DD-DA or may be omitted.

Figure 2:
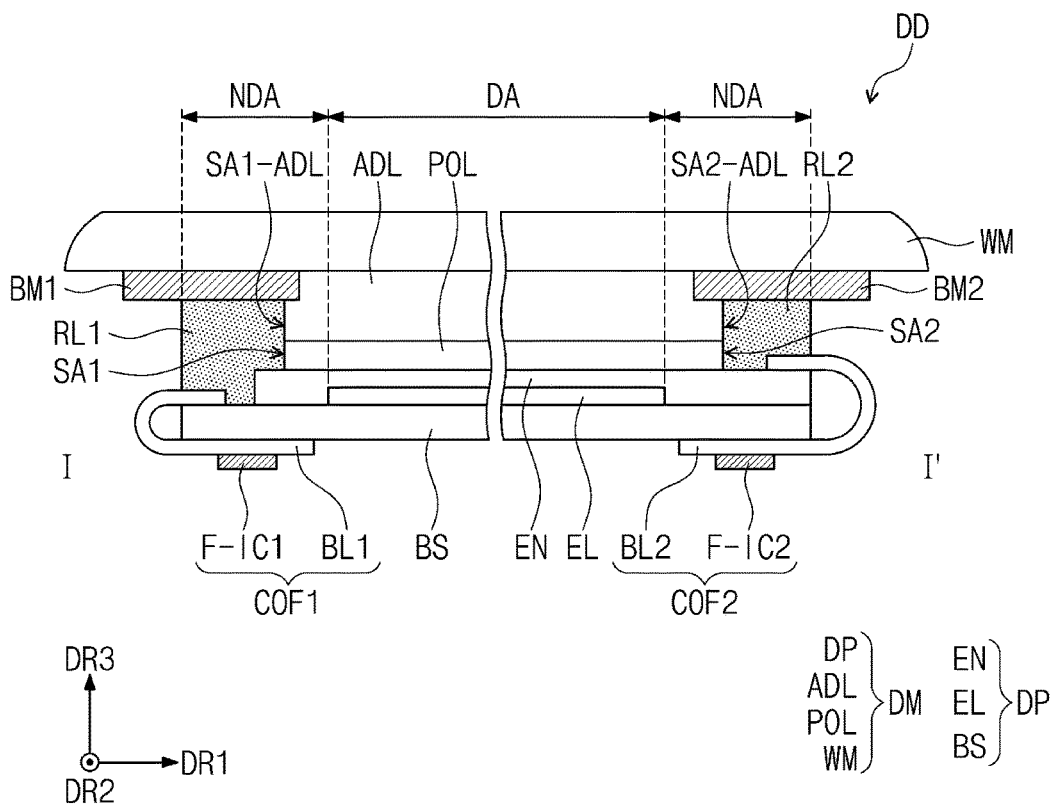
FIG. 2 is a cross-sectional view showing a display device according to an embodiment of the present disclosure.

FIG. 2 is a cross-sectional view showing the display device DD according to an embodiment of the present disclosure. FIG. 2 shows a cross-section taken along a line I-I' of FIG. 1 to show the display device DD in further detail. Hereinafter, the display device DD will be described in detail with reference FIG. 2.

Referring to FIG. 2, the display device DD may include a display panel DP, a first flexible circuit board COF1, a window WM, an optical film POL, and a first filling layer RL1.

The display panel DP may include an active area DA and a peripheral area NDA. The active area DA may be an area in which a light emitting element layer EL is disposed, and the peripheral area NDA may be a remaining area ire which the light emitting element layer EL is not disposed.

The display panel DP may include a base substrate BS, the light emitting element layer EL disposed on the base substrate BS, and an encapsulation layer EN disposed on the light emitting element layer EL. The base substrate BS may include a polymer substrate or a glass substrate, however, the material of the base substrate BS is not necessarily limited thereto.

A light emitted from the light emitting element layer EL may emit to the outside through a portion where the window WM overlaps the active area DA. The light emitted outside from the light emitting element layer EL may constitute the image IM (refer to FIG. 1) on the display surface DD-IS (refer to FIG. 1) of the display device DD.

The light emitting element layer EL may be an organic light emitting element layer. However, this is an illustrative example, and the embodiment should not necessarily be limited thereto. For example, according to an embodiment, the light emitting element layer EL may be a quantum dot light emitting element layer or a liquid crystal element layer.

The encapsulation layer EN may cover the light emitting element layer EL. According to an embodiment, the encapsulation layer EN may include at least one inorganic layer.

The inorganic layer tray protect the light emitting element layer EL from moisture and oxygen. The encapsulation layer EN may include at least one organic layer. The organic layer may protect the light emitting element layer EL from foreign substances such as dust particles.

The first flexible circuit board COF1 may be disposed in the peripheral area NDA at one side of the active area DA of the display panel DP. An edge portion of the encapsulation layer EN may be disposed on an edge of the base substrate BS at one side of the display panel DP where the first flexible circuit board COF1 is disposed. A portion of the base substrate BS may be covered by the encapsulation layer EN at the one side of the display panel DP where the first flexible circuit board COF1 is disposed. For example, a portion of the base substrate BS may be partially exposed since it is not covered by the encapsulation layer EN.

The first flexible circuit board COF1 may be disposed directly on the base substrate BS. One side of the first flexible circuit board COF1 may be disposed directly on an upper surface of the base substrate BS, and the other side of the first flexible circuit board COF1 may be disposed directly on a lower surface of the base substrate BS. For example, the first flexible circuit board COF1 may wrap around an edge portion of the base substrate BS such that it is disposed simultaneously on upper and lower surfaces of the base substrate BS.

The first flexible circuit board COF1 may include a first base layer BL1 and a first driving chip F-IC1 disposed on the first base layer BL1. The first base layer BL1 may include a polymer resin. For example, the first base layer BL1 may include polyimide. The first driving chip F-IC1 may receive electrical signals from a plurality of pads.

According to an embodiment, the display device DD may include a plurality of first flexible circuit boards COF1. The first flexible circuit boards COF1 may be arranged and spaced apart from each other in the second direction DR2.

The window WM may be disposed on the display panel DP. The display device DD may have an outer shape defined by the window WM. The display surface DD-IS (referring to FIG. 1) of the display device DD may be defined substantially in the window WM. The window WM may include an optically transparent insulating material. For example, the window WM may include a polyimide resin film, a resin film, a resin substrate, or a thin glass substrate.

When viewed in a plane, the window WM may have an area greater than an area of the display panel DP. When viewed in a cross-section, the width of the display panel DP may be disposed within the width of the window WM in at least the first direction. For example, the display panel DP may be entirely covered by the window WM.

The optical film POL may be disposed between the display panel DP and the window WM. The optical film POL may reduce a reflectance of an external light incident thereto from the outside of the window WM with respect to the display panel DP. According to an embodiment, the optical film POL may include a polarization film or a color filter.

The first filling layer RL1 may be filled in a space at least partially defined by the window WM, the display panel DP, a side surface SA1 of the optical film POL that is exposed, and a side surface SA1-ADL of an optically transparent adhesive ADL (to be described later). The first filling layer RL1 may include a resin. For example, the first filling layer RL1 may include acryl, silicon, or urethane.

The first filling layer RL1 may at least partially cover the first flexible circuit board COF1. Accordingly, pads arranged on the first flexible circuit board COF1 may be protected from external shocks.

The first filling layer RL1 may contact the window WM, the base substrate BS, the first flexible circuit board COF1, the encapsulation layer EN, and the exposed side surface SA1 of the optical film POL. The display device DD according to the present disclosure includes the first filling layer RL1 filled in between the window WM and the display panel DP without leaving empty space, and accordingly the display device DD of the present disclosure may have superior shock resistance property.

According to an embodiment, the display device DD may further include a second flexible circuit board COF2 disposed in the peripheral area NDA at the other side of the display panel DP spaced apart from the first flexible circuit board COF1; for example, the peripheral area NDA across from the above-described NDA as spaced apart in the first direction. FIG. 2 shows the structure in which the first flexible circuit board COF1 and the second flexible circuit board COF2 are spaced apart from each other in the first direction DR1, however, the embodiment should not necessarily be limited thereto.

The base substrate BS may be entirely covered by the encapsulation layer EN at the other side of the display panel DP where the second flexible circuit board COF2 is disposed. One side of the second flexible circuit board COF2 may be disposed on the encapsulation layer EN, and the other side of the second flexible circuit board COF2 may be disposed under the base substrate BS. However, this is an illustrative example, and the embodiment should not necessarily be limited thereto.

The second flexible circuit board COF2 may include a second base layer BL2 and a second driving chip F-IC2 disposed on the second base layer BL2. The second base layer BL2 may include a polymer resin. For example, the second base layer BL2 may include polyimide. The second driving chip F-IC2 may receive electrical signals from a plurality of pads.

According to an embodiment, the display device DD may include a plurality of second flexible circuit boards COF2. The second flexible circuit boards COF2 may be arranged along and spaced apart from each other in the second direction DR2.

According to embodiment, the display device DD may further include a second filling layer RL2. The second filling layer RL2 may be filled in a space at least partially defined by the window WM, the display panel DP, a side surface SA2 of the optical film POL that is exposed, and a side surface SA2-ADL of an optically transparent adhesive ADL (to be described later). The second filling layer RL2 may at least partially cover the second flexible circuit board COF2.

The second filling layer RL2 may contact the window WM, the second flexible circuit board COF2, the encapsulation layer EN, and the exposed side surface SA2 of the optical film POL. The display device DD according to the present disclosure includes the second filling layer RL2 filled in between the window WM and the display panel DP at the other side without leaving empty space, and accordingly the display device DD of the present disclosure may have superior shock resistance property.

According to an embodiment, the display device DD may further include an optically transparent adhesive ADL disposed bet keen the optical film POL and the window WM. The optically transparent adhesive layer ADL may be an adhesive layer that is optically clear; for example, it may be a layer that substantially allows visible light to pass through. The optically transparent adhesive ADL may adhere and fix the optical film POL to the window WM. The first filling layer RL1 may be filled in a spaced defined by the window WM, the display panel DP, the exposed side surface SA1 of the optical film POL, and a side surface SA1-ADL of the optically transparent adhesive ADL that is exposed. The first filling layer RL1 may contact the side surface SA1-ADL of the exposed optically transparent adhesive ADL.

According to an embodiment, the second filling layer RL2 may be filled in a space defined by the window WM, the display panel DP, the exposed side surface SA2 of the optical film POL, and a side surface SA2-ADL of the optically transparent adhesive ADL that is exposed. The second filling layer RL2 may contact the exposed side surface SA2-ADL of the optically transparent adhesive ADL.

According to an embodiment, the display device DD may further include a first light blocking member BM1 disposed between the window WM and the first filling layer RL1 and a second light blocking member BM2 disposed between the window WM and the second filling layer RL2. The first light blocking member BM1 may contact the first filling layer RL1. The second light blocking member BM2 may contact the second filling layer RL2.

The first light blocking member BM1 and the second light blocking member BM2 may be or include a black matrix. The first light blocking member BM1 and the second light blocking member BM2 may include an organic light blocking material or an inorganic light blocking material which contains a black dye or a black pigment. The first light blocking member BM1 and the second light blocking member BM2 may prevent light from leaking to the outside.

Figure 3:
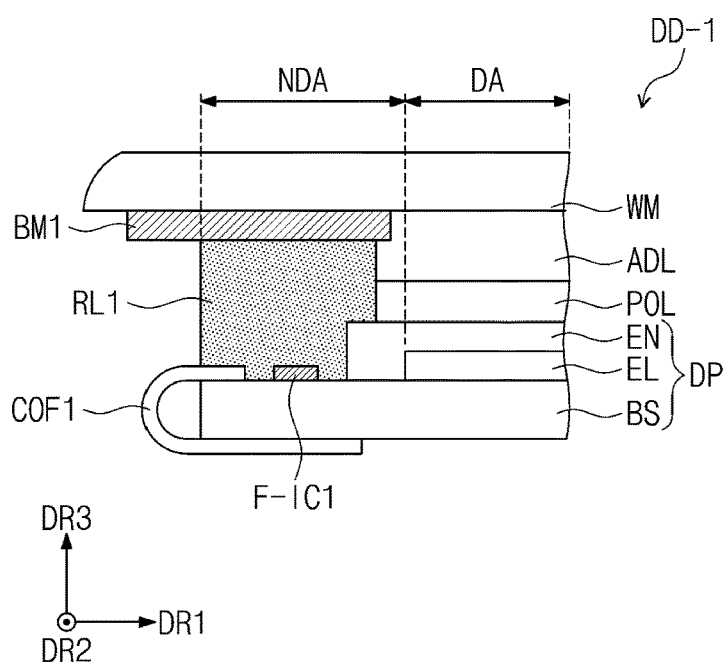
FIG. 3 is a cross-sectional view showing a portion of a display device according to an embodiment of the present disclosure.

FIG. 3 is a cross-sectional view showing a portion of a display device DD-1 according to an embodiment of the present disclosure. FIG. 3 shows a cross-section of the display device DD-1 taken along a line I-I' of FIG. 1. In FIG. 3, the same reference numerals denote the same elements in FIGS. 1 and 2, and accordingly, detailed descriptions of the same element will be omitted, and different features will be mainly described.

According to the display device DD-1 shown in FIG. 3, a first driving chip F-IC1 may be disposed on a base substrate BS of a display panel DP rather than a first base layer BL1 of a first flexible circuit board COF1.

Referring to FIG. 3, the display device DD-1 may include the first driving chip F-IC1 disposed on the base substrate BS. The first driving chip F-IC1 may be covered a first filling layer RL1. According to an embodiment, in the display device DD-1, the driving chip F-IC1 may be disposed on the base substrate BS by a chip-on-glass (COG) method or a chip-on-plastic (COP) method.

Hereinafter, an apparatus for manufacturing the display device (hereinafter, referred to as a display device manufacturing apparatus) will be described with reference to FIG. 4.

Figure 4:
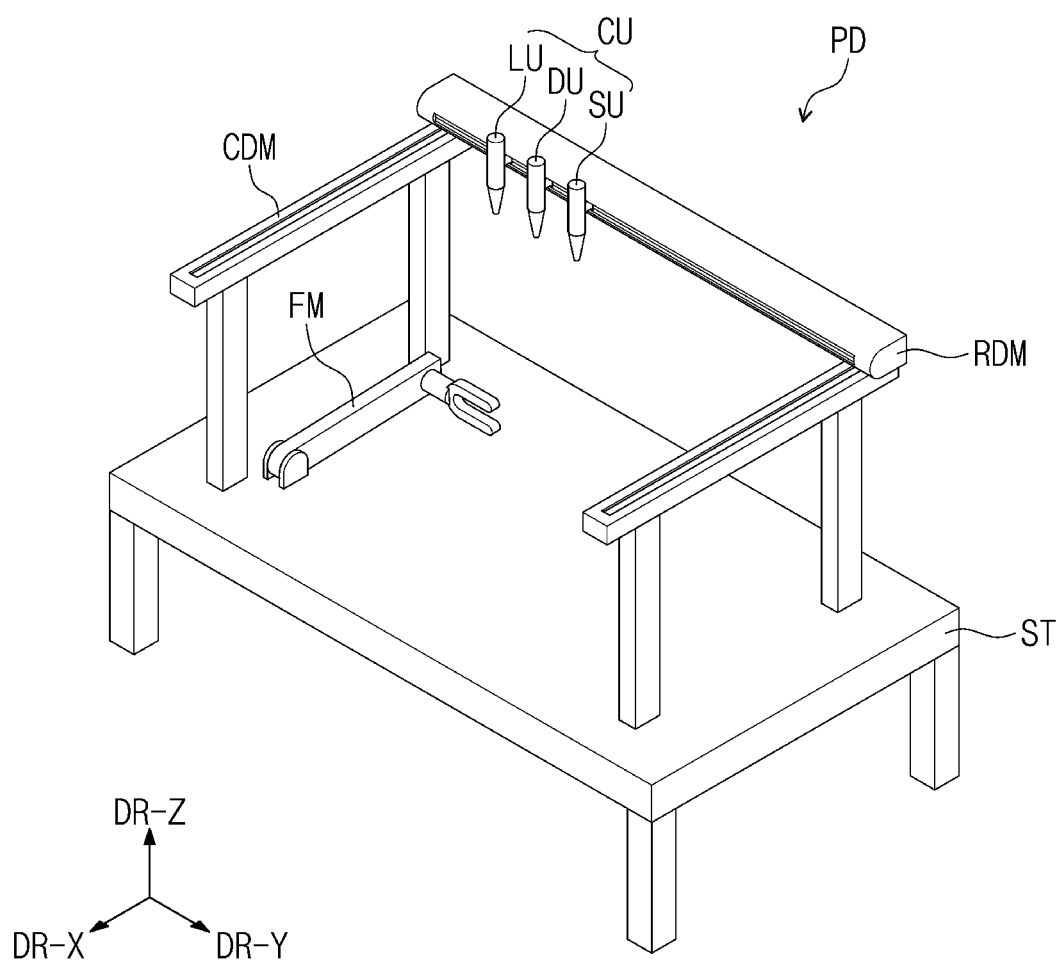
FIG. 4 is a perspective view showing an apparatus for manufacturing a display device according to an embodiment of the present disclosure.

FIG. 4 is a perspective view showing the display device manufacturing apparatus according to an embodiment of the present disclosure.

The display device manufacturing apparatus PD may include a stage ST, a bonding unit CU, and a fixing unit FM.

The bonding unit CU may be disposed on the stage ST. The bonding unit CU may move in a Y-direction DR-Y by a first guide RDM. The first guide RDM may move in an X-direction DR-X by a second guide CDM. The bonding unit CU may be configured to move in the X-direction DR-X and the Y-direction DR-Y above the stage ST by the first guide RDM and the second guide CDM, respectively.

The bonding unit CU may include a position detection sensor SU, a resin supply unit DU, and a light irradiation unit LU. The position detection sensor SU, the resin supply unit DU, and the light irradiation unit LU may be arranged on the first guide RDM.

The position detection sensor SU may sense a path to coat a filling agent from the resin supply unit DU on a target member The position detection sensor SU may include a laser sensor that irradiates a laser beam to sense a coating path of the filling agent coated on the target member.

The position detection sensor SU, the resin supply unit DU, and the light irradiation unit LU may be individually controlled. For example, the position detection sensor SU, the resin supply unit DU, and the light irradiation unit LU may individually move in the Y-direction DR-Y along the first guide RDM. The position detection sensor SU, the resin supply unit DU, and the light irradiation unit LU may individually move in the X-direction DR-X in the first guide RDM.

According to an embodiment, the target member may be the display module DM described with reference to FIG. 2. Further referring to FIG. 2, the display module DM may include the display panel DP which includes the active area DA and the peripheral area NDA, the first flexible circuit board COF1 disposed in the peripheral area NDA at the one side of the display panel DP, the window WM disposed on the display panel DP, and the optical film POL disposed between the display panel DP and the window WM. According to an embodiment, the position detection sensor SU may sense the coating path between the window WM and the display panel DP.

The resin supply unit DU may coat a liquefied resin along the coating path sensed by the position detection sensor SU. According to, an embodiment, the resin supply unit DU may maintain a first distance DT1 (refer to FIG. 11) from the position detection sensor SU while moving. For example, the first distance DT1 may be a distance between the resin supply unit DU and the position detection sensor SU on the first coating path D-PT1.

The light irradiation unit LU may provide a light to cure the liquefied resin coated on the target member while moving along the sensed coating path by the position detection sensor SU. The light irradiation unit LU may maintain a second distance DT2 (refer to FIG. 12) from the resin supply unit DU while moving. For example, the second distance DT2 may be a distance between the resin supply unit DU and the light irradiation unit LU on the first coating path D-PT1.

The light provided by the light irradiation unit LU may be an ultraviolet light, however, this is an illustrative example, and the embodiment should not necessarily be limited thereto.

The fixing unit FM may be disposed closer to the stage ST than the bonding unit CU is. For example, the fixing unit FM may be disposed on a working surface of the stage ST. The fixing unit FM may fix the target member. The fixing unit FM may operate such that one side edge of the target member is disposed under the bonding unit CU. For example, the fixing unit FM may be a robot arm configured to rotate the target member fixed to one side thereof.

According to an embodiment, the position detection sensor SU and the resin supply unit DU may maintain the first distance DT1 (refer to FIG. 11) while moving. The resin supply unit DU and the light irradiation unit LU may maintain the second distance DT2 (refer to FIG. 12) while moving. In one embodiment, the position detection sensor SU and the resin supply unit DU may maintain the first distance DT1 (refer to FIG. 11), and the resin supply unit DU and the light irradiation unit LU may maintain the second distance DT2 (refer to FIG. 12) while the position detection sensor SU, the resin supply unit DU, and the light irradiation unit LU substantially and simultaneously move together with each other. The second distance DT2 (refer to FIG. 12) may be smaller than the first distance DT1 (refer to FIG. 11).

In some conventional examples of display device fabrication where a time from the coating of the liquefied resin to the curing of the liquefied resin is lengthened, defects may occur in an appearance of the display device due to the flow of the liquefied resin. In the display device manufacturing apparatus PD according to an embodiment, since the second distance DT2 is small, the liquefied resin provided from the resin supply unit DU may be quickly cured by the light from the light irradiation unit LU. Accordingly, the display device manufacturing apparatus PD may prevent the defects in the appearance of the display device caused by the flow of the liquefied resin. Accordingly, a display quality and usability may be increased.

Hereinafter, a method of manufacturing the display device according to an embodiment of the present disclosure will be described with reference to FIGS. 5 to 10.

Figure 5:
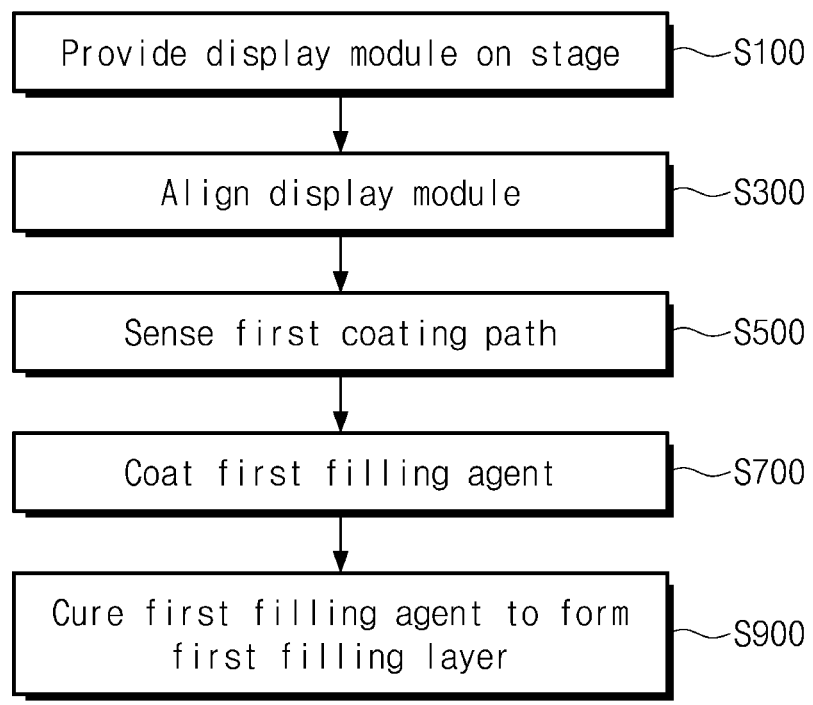
FIG. 5 is a flowchart of a method of manufacturing a display device according to an embodiment of the present disclosure.

FIG. 5 is a flowchart of a method of manufacturing the display device according to an embodiment of the present disclosure. FIGS. 6 to 10 are perspective views showing processes of the manufacturing method of the display device according to an embodiment of the present disclosure. Hereinafter, in describing the manufacturing method of the display device with reference to FIGS. 5 to 10, descriptions on the same elements as those of FIGS. 1 to 4 will be omitted, and features of the manufacturing method will be described in detail.

Referring to FIG. 5, the manufacturing method of the display device DD includes providing the display module on the stage (S100), aligning the display module (S300), sensing the first coating path (S500), coating a first filling agent (S700), and curing the first filling agent to form the first filling layer (S900).

Figure 6:
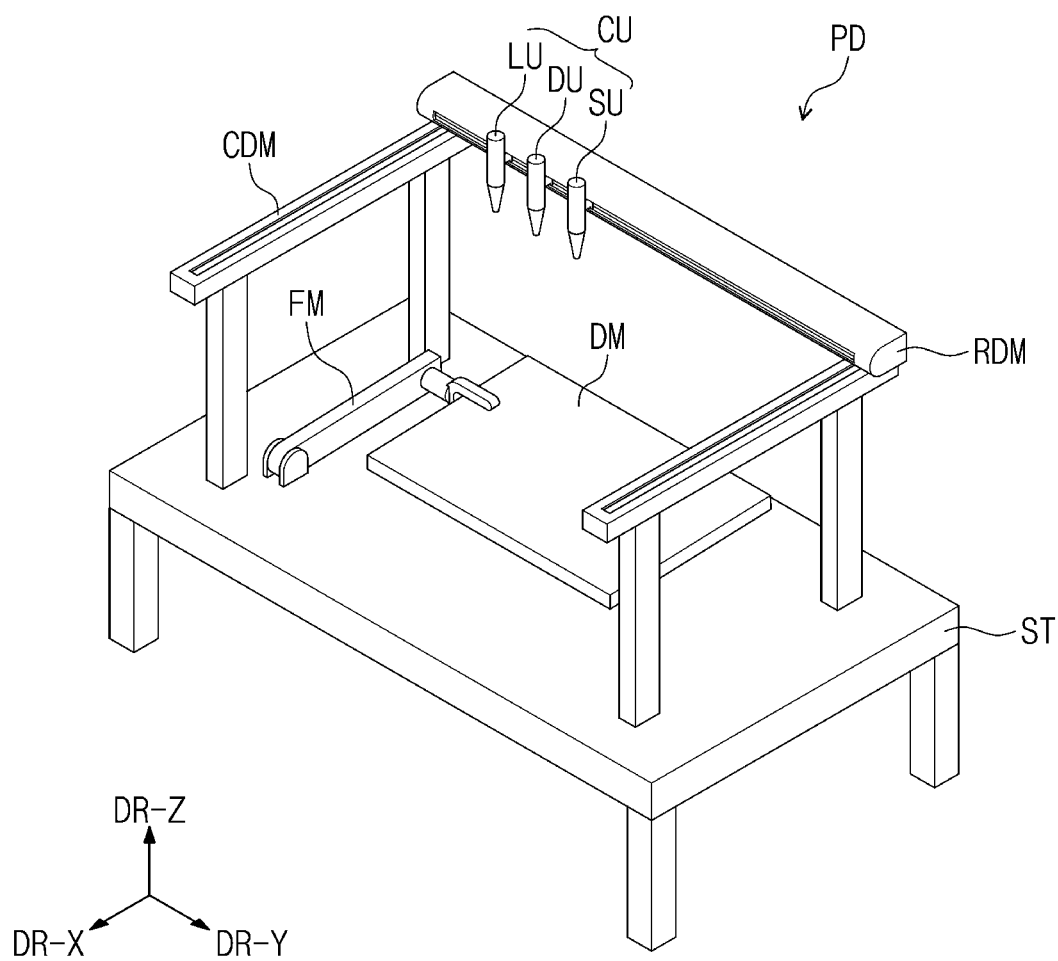
FIG. 6 is a perspective view showing one process of a manufacturing method of a display device according to an embodiment of the present disclosure.

FIG. 6 is a schematic view of the step of providing of the display module DM on the stage ST (S100). Referring to FIG. 6, the step of providing the display module DM on the stage ST (S100) may include providing the display module DM on the fixing unit FM disposed on the stage ST. FIG. 6 shows the robot arm as the fixing unit FM, however, this is an illustrative example. The embodiment should not necessarily be limited thereto as long as the fixing unit FM may fix and rotate the display module DM.

Figure 7:
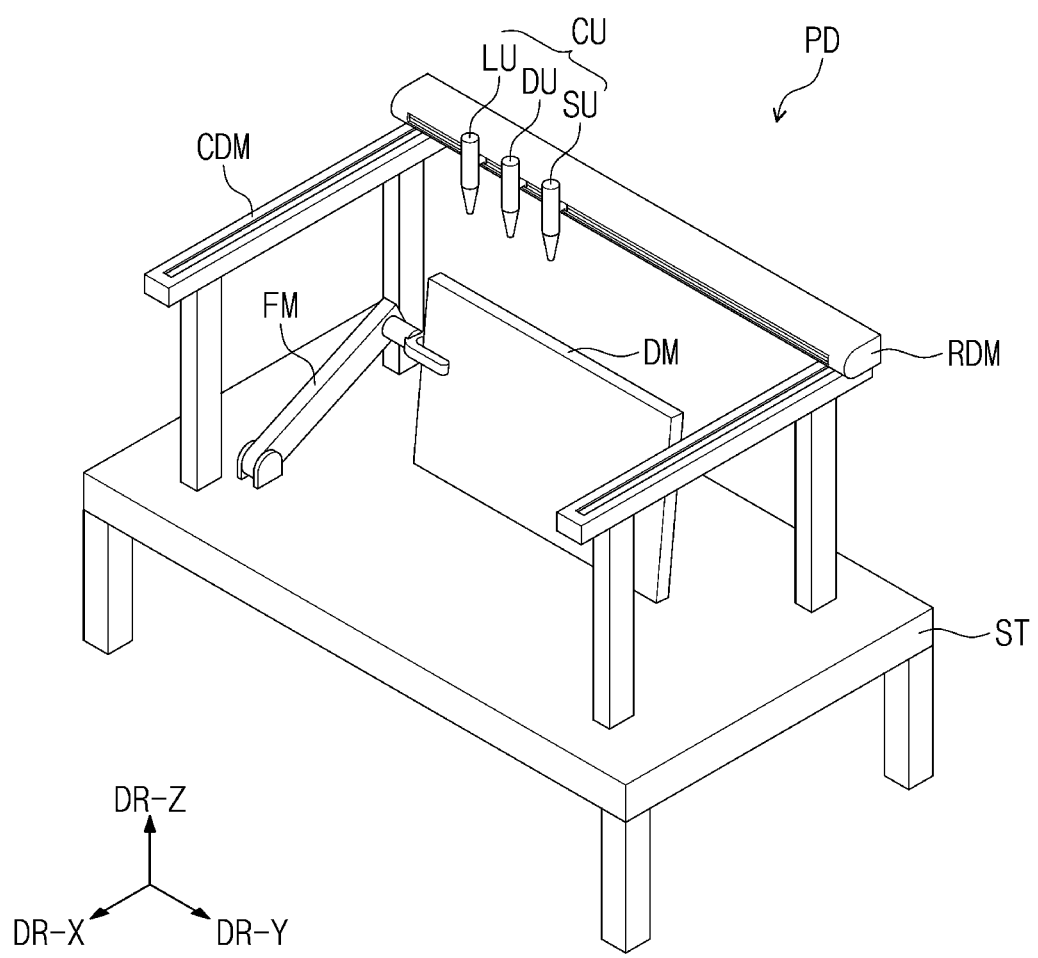
FIG. 7 is a perspective view showing one process of a manufacturing method of a display device according to an embodiment of the present disclosure.

FIG. 7 is a schematic view showing the step of aligning of the display module DM (S300). Referring to FIG. 7, the step of aligning the display module DM (S300) may include aligning the display module DM such that one side edge of the display module DM, where the first flexible circuit board COF1 (refer to FIG. 2) is disposed, is disposed under the bonding unit CU. For example, where the display module DM is disposed under the bonding unit CU, the display module DM pray be disposed substantially parallel to the bonding unit CU in a Z-direction DR-Z and the display module DM may be disposed between the bonding unit CU and the stage ST. FIG. 7 shows the robot arm as the fixing unit FM, however, this is an illustrative example, and the embodiment should not necessarily be limited thereto.

Figure 8:
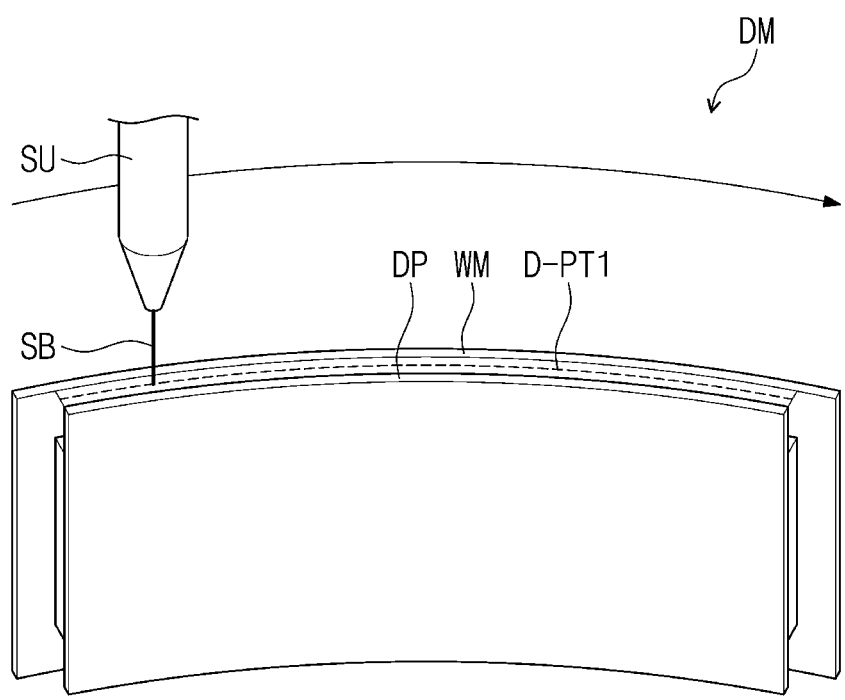
FIG. 8 is a perspective view showing one process of a manufacturing method of a display device according to an embodiment of the present disclosure.

FIG. 8 is a schematic view of the step of sensing of the first coating path (S500). Referring to FIG. 8, the step of sensing the first coating path D-PT1 (S500) may include sensing the first coating path D-PT1 by moving the position detection sensor SU along the one side edge of the display module DM. The first coating path D-PT1 may an imaginary line follow a line corresponding to a shape of the one side edge of the display module DM. The first coating path D-PT1 may be disposed between the window WM and the display panel DP.

According to an embodiment, the sensing of the first coating path D-PT1 (S500) may be include irradiating a sensing beam SB along the one side edge of the display module DM while using the position detection sensor SU to sense the first coating path D-PT1. According to an embodiment, the position detection sensor SU may be, but not limited to, the laser sensor that irradiates and receives the laser beam to sense the position.

Figure 9:
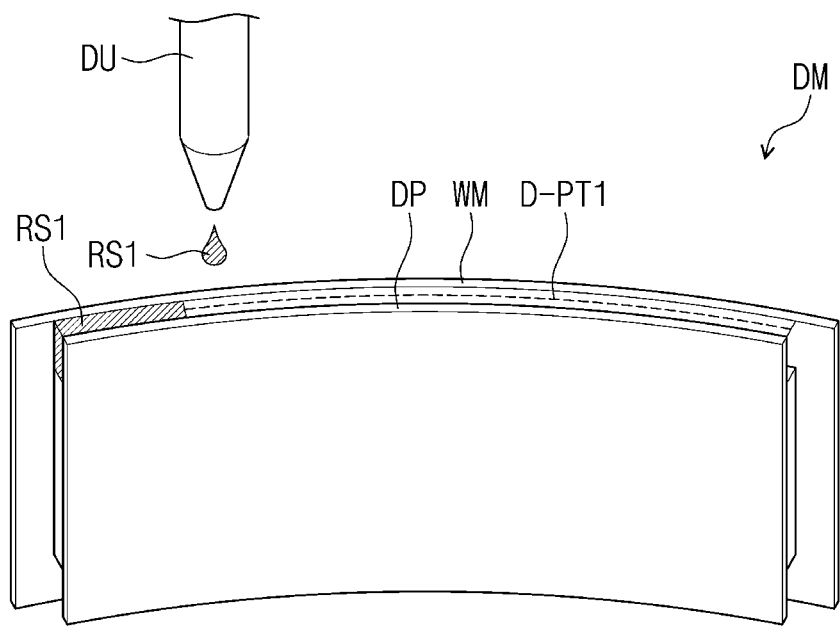
FIG. 9 is a perspective view showing one process of a manufacturing method of a display device according to an embodiment of the present disclosure.
Figure 9:
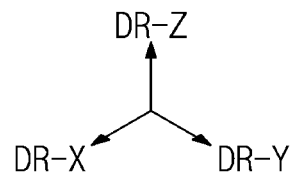

FIG. 9 is a schematic view of the step of coating of the first filling agent (S700).

Referring to FIG. 9, the step of coating the first filling agent RS1 (S700) may include coating the first filling agent RS1 along the first coating path D-PT1 by the resin supply unit DU. The first filling agent RS1 may include a polymer resin. The first filling agent RS1 may include a light-curing material.

The coating of the first filling agent RS1 (S700) may include filling the first filling agent RS1 in the space defined by the display panel DP, the window WM, and the exposed side surface SA1 (refer to FIG. 2) of the optical film POL (refer to FIG. 2).

When processes are performed on the display device DD while the display device is being kept upright, a curvature of the display device may as a frontal area of the display device increases. For example, in a case where a display device DD is fabricated with a curved screen, the screen may veer off from a reference plane near the edges of the screen. Accordingly, if the filling agent is coated on the curved display device DD using a resin supply unit that moves along a straight path, the filling agent may be applied on an outer surface of the display device DD. For example, where the first filling agent RS1 is coated without correcting the path, the first filling agent RS1 may be coated on outer surfaces of the display panel DP, and the window WM, and on upper portions of the display panel DP and the window WM in addition to between the window WM and the display panel DP. As a result, defects may occur in the appearance of the display device DD. According to an embodiment of the present disclosure, however, the manufacturing method of the display device DD may include the sensing of the first coating path D-PT1 between the display panel DP and the window WM, which are disposed under the position detection sensor SU, using the position detection sensor SU (S500, refer to FIG. 8), and accordingly, the first filling agent RS1 may be filled between the display panel DP and the window WM without overflowing of the first filling agent RS1.

Figure 10:
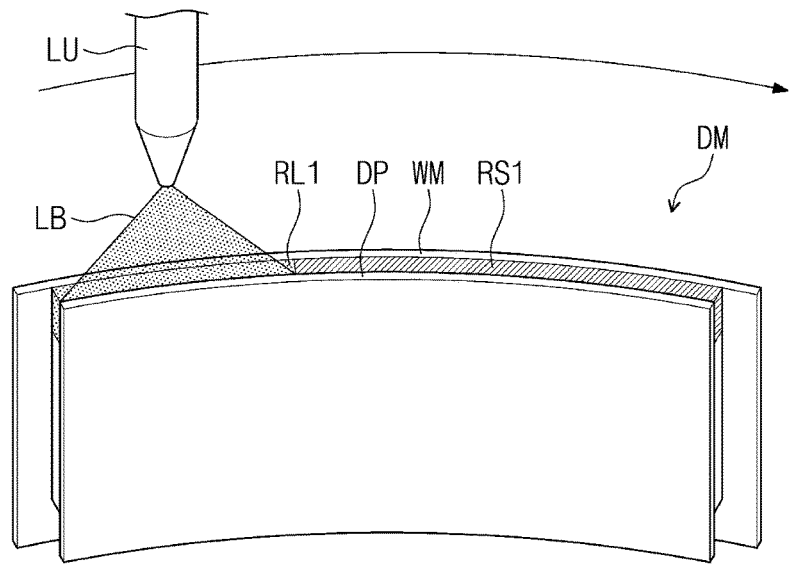
FIG. 10 is a perspective view showing one process of a manufacturing method of a display device according to an embodiment of the present disclosure.
Figure 10:
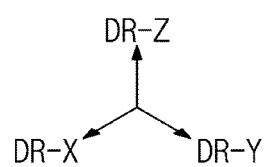

FIG. 10 is a schematic view of the step of curing of the first filling agent to form the first filling layer (S900). Referring to FIG. 10, the step of curing the first filling agent RS1 to form the first filling layer RL1 (S900) may include irradiating the light LB along the first coating path D-PT1 onto the first filling agent RS1 coated by the light irradiation unit to form the first filling layer RL1. However, this is an illustrative example, and the embodiment should not necessarily be limited thereto. For example, the light irradiation unit LU may be fixed and may irradiate the light in a wide range to the coated first filling agent RS1.

Hereinafter, the display device manufacturing method will be described in detail with reference to FIGS. 11 to 14. In FIGS. 11 to 14, the descriptions of the same elements as those in FIGS. 5 to 10 will be omitted, and different features will be mainly described.

Figure 11:
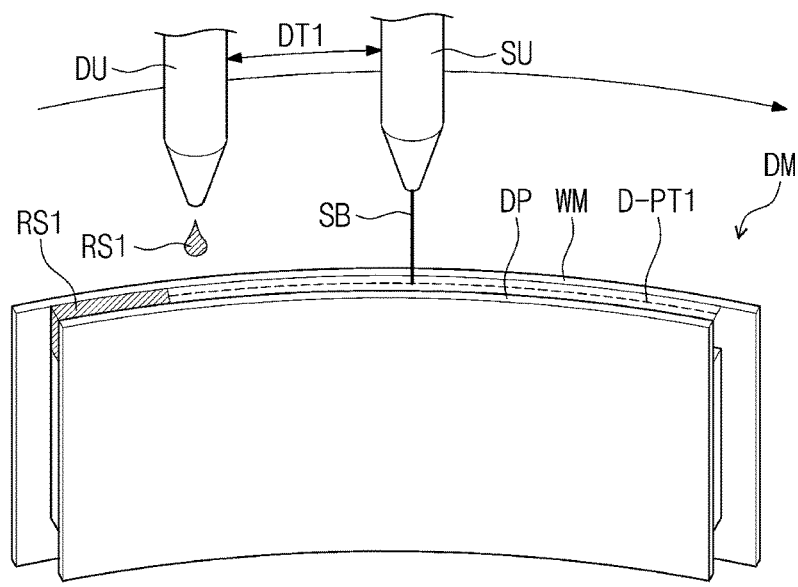
FIG. 11 is a perspective view showing one process of a manufacturing method of a display device according to an embodiment of the present disclosure.
Figure 11:
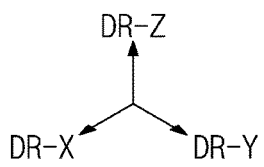

FIG. 11 is a schematic view of the step of sensing the first coating path (S500) and the coating the first filling agent (S700) in the display device manufacturing method. By way of contrast from the display device manufacturing method described with reference to FIGS. 5 to 10, the position detection sensor and the resin supply unit may move while maintaining a certain distance from each other as illustrated in FIG. 11.

Referring to FIG. 11, the position detection sensor SU and the resin supply unit DU may maintain the first distance DT1 while moving.

Figure 12:
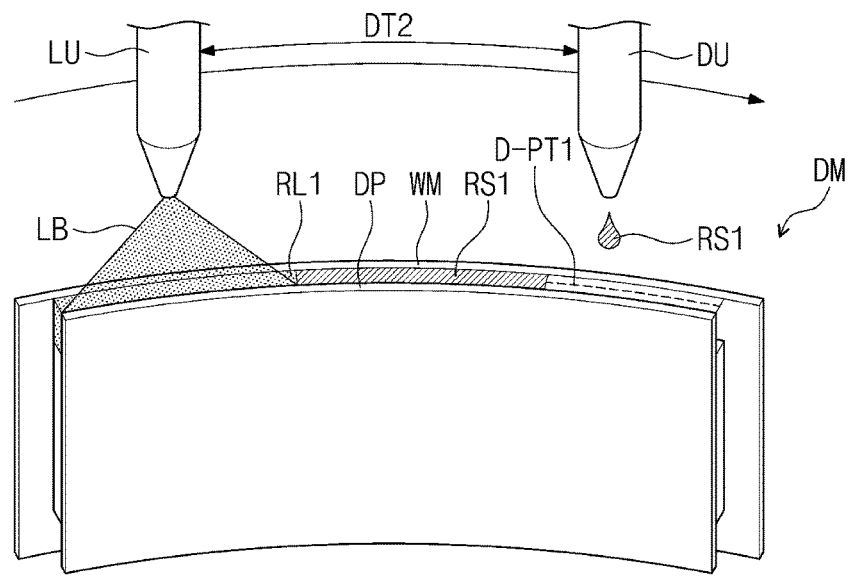
FIG. 12 is a perspective view showing one process of a manufacturing method of a display device according to an embodiment of the present disclosure.

FIG. 12 is a schematic view of the step of coating the first filling agent (S700) and the curing of the first filling agent to form the first filling layer (S900) in the display device manufacturing method. By way of contrast from the display device manufacturing method described with reference to FIGS. 5 to 10, the resin supply unit and the light irradiation unit may move while maintaining a certain distance from each other as illustrated in FIG. 12.

Referring to FIG. 12, the resin supply unit DU and the light irradiation unit LU may maintain the second distance DT2 while moving. When the resin supply unit DU and the light irradiation unit LU substantially simultaneously move while maintaining the second distance DT2, the coated first filling agent RS1 may be cured evenly and predictably, and thus, the first filling layer RL1 may be quickly formed. The first filling agent RS1 may be quickly cured to form the first filling layer RL1, and accordingly, the first filling agent RS1 may be prevented from flowing to the outer surface of the display panel DP or the window WM.

Figure 13:
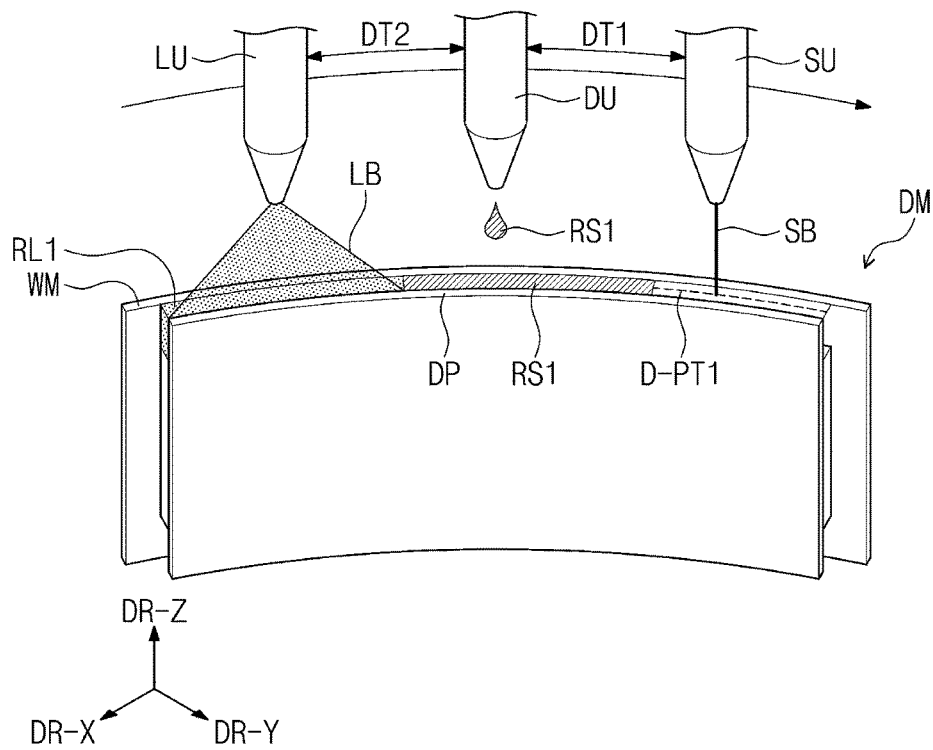
FIG. 13 is a perspective view showing one process of a manufacturing method of a display device according to an embodiment of the present disclosure.

FIG. 13 is a schematic view of the steps of sensing the first coating path (S500), coating the first filling agent (S700), and curing the first filling agent to form the first filling layer (S900) in the display device manufacturing method. By way of contrast from the display device manufacturing method described with reference to FIGS. 5 to 10, the position detection sensor, the resin supply unit, and the light irradiation unit may move while maintaining certain distances from each other as illustrated in FIG. 13.

Referring to FIG. 13, the position detection sensor SU and the resin supply unit DU may maintain the first distance DT1 while moving, and the resin supply unit DU and the light irradiation unit LU may maintain the second distance DT2 while moving. The second distance DT2 may be smaller than the first distance DT1.

As the size of the display device DD increases, a time interval between the coating of the filling agent and the irradiating of the light to cure the filling agent may be lengthened. When a time is lengthened during which the filling agent remains uncured, the uncured filling agent may flow to a location other than a point at which the filling agent is coated, and accordingly defects may occur in the appearance of the display device DD. According to the display device manufacturing method, however, the light irradiation unit LU and the resin supply unit DU may move on the first coating path D-PT1 while maintaining the certain distance there between, and thus, the first filling agent RS1 may be cured right after it is coated. For example, according to the manufacturing method of the present disclosure of the display device DD, the first filling layer RL1 may be formed by irradiating the light to the first filling agent RS1 within a short time after the first filling agent RS1 is coated. Accordingly, the defects of the appearance of the display device DD caused by the uncured first filling agent RS1 may be prevented.

Figure 14:
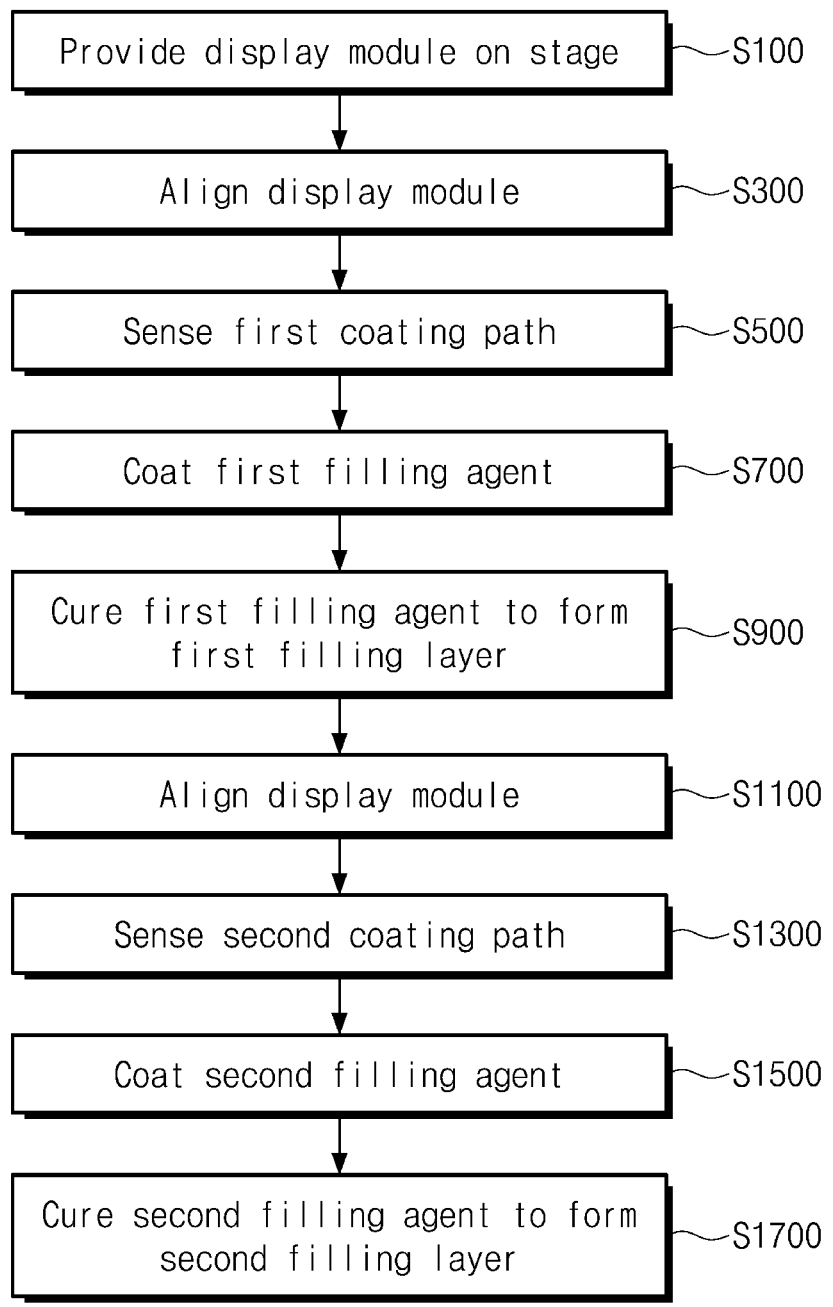
FIG. 14 is a flowchart of a method of manufacturing a display device according to an embodiment of the present disclosure.

FIG. 14 is a flowchart of a manufacturing method of a display device according to an embodiment of the present disclosure. By way of contrast from the manufacturing method of the display device described with reference to FIGS. 5 to 10, the manufacturing method of the display device may further include aligning the display module after forming the first filling layer (S1100), sensing of a second coating path (S1300), coating a second filling agent (S1500), and curing the second filling agent to form the second filling layer (S1700).

Referring to FIG. 14, the manufacturing method of the display device may further include aligning of the display module (S1100) after forming the first filling layer (S900), sensing the second coating path (S1300), coating the second filling agent (S1500), and curing the second filling agent to form the second filling layer (S1700). The forming of the second filling layer (S1700) may be performed by the same method as the method of forming the first filling layer described with reference to FIGS. 5 to 10. Accordingly display device DD of FIG. 2 may be obtained by the manufacturing method of the display device shown in FIG. 14.

According to an embodiment, the manufacturing method of the display device includes sensing a filling agent coating path between a window and a display panel. Accordingly, defects in the appearance caused by the flowing of the filling agent to the outer surface of the display device may be prevented, and the filling agent may be filled in between the window and the display panel without leaving empty space.

According to an embodiment, the manufacturing method of the display device includes a position detection sensor that senses the coating path of the target member, and accordingly, the filling agent may be provided without causing defects in the appearance of the target member.

According to an embodiment, the display device includes a filling layer filled in between the window and the display panel, and thus, the display device may have superior shock resistance property.

Although the embodiments of the present disclosure have been described, it is understood that the present disclosure should not necessarily be limited to these embodiments, and that various changes and modifications can be made by one ordinary skilled in the art within the spirit and scope of the present disclosure as hereinafter claimed.

What is claimed is:

1. A method of manufacturing a display device using a display device manufacturing apparatus comprising a stage, a fixing unit, and a bonding unit disposed on the stage and comprising a position detection sensor, a light irradiation unit, and a resin supply unit disposed between the position detection sensor and the light irradiation unit, the method comprising:
    disposing a display module on the stage, the display module comprising a display panel comprising an active area and a peripheral area, a first side edge, a first flexible circuit board disposed in the peripheral area near the first side edge, a window disposed on the display panel, and an optical film disposed between the display panel and the window;
    aligning the display module such that the first side edge of the display module is disposed under the bonding unit;
    moving the position detection sensor along the first side edge of the display module to sense a first coating path;
    moving the resin supply unit along the sensed first coating path to coat a first filling agent between the window and the display panel; and
    moving the light irradiation unit along the sensed first coating path to cure the coated first filling agent to form a first filling layer.

2. The method of claim 1, wherein the position detection sensor, the resin supply unit, and the light irradiation unit are arranged in the bonding unit such that the resin supply unit is disposed between the position detection sensor and the light irradiation unit, and the resin supply unit and the position detection sensor maintain a first distance from each other while moving along the first coating path in the coating of the first filling agent.

3. The method of claim 2, wherein the light irradiation unit and the resin supply unit maintain a second distance from each other while moving along the first coating path in the forming of the first filling layer.

4. The method of claim 1, wherein the coating of the first filling agent comprises coating the first filling agent in a space defined by the display panel, the window facing the display panel, and a side surface of the optical film that is exposed.

5. The method of claim 1, wherein the first coating path corresponds to a shape of the first side edge of the display module and is positioned between the window and the display panel.

6. The method of claim 1, wherein the display module further comprises a second flexible circuit board disposed in the peripheral area near a second side edge of the display panel and spaced apart from the first flexible circuit board, and after the forming of the first filling layer, the method further comprises:

aligning the display module such that the second side edge of the display module is disposed under the bonding unit;

moving the position detection sensor along the second side edge of the display module to sense a second coating path;

moving the resin supply unit along the sensed second coating path to coat a second filling agent between the window and the display module; and moving the light irradiation unit along the sensed second coating path to cure the coated second filling agent to form a second filling layer.

7. The method of claim 6, wherein the second coating path corresponds to a shape of the second side edge of the display module and is positioned between the window and the display panel.

* * * * *